(12) United States Patent
Dhablania et al.

(10) Patent No.: US 6,523,050 B1
(45) Date of Patent: Feb. 18, 2003

(54) INTEGER TO FLOATING POINT CONVERSION USING ONE'S COMPLEMENT WITH SUBSEQUENT CORRECTION TO ELIMINATE TWO'S COMPLEMENT IN CRITICAL PATH

(75) Inventors: Atul Dhablania, San Jose, CA (US); Jeffrey A. Lohman, Plano, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/377,136

(22) Filed: Aug. 19, 1999

(51) Int. Cl.[7] .................................................. G06F 7/00
(52) U.S. Cl. ........................................................ 708/204
(58) Field of Search ................................. 708/204–205

(56) References Cited

U.S. PATENT DOCUMENTS

| | | |
|---|---|---|
| 4,949,291 A | 8/1990 | Saini |
| 5,040,138 A | 8/1991 | Maher, III |
| 5,144,570 A | 9/1992 | Maher, III |
| 5,161,117 A | 11/1992 | Waggener |
| 5,257,215 A | 10/1993 | Poon |
| 5,272,654 A | 12/1993 | Nix |
| 5,561,615 A | 10/1996 | Kuo et al. |
| 5,584,009 A | 12/1996 | Garibay, Jr. et al. |
| 5,619,198 A | 4/1997 | Blackham et al. |
| 5,633,819 A | 5/1997 | Brashears et al. |
| 5,644,741 A | 7/1997 | Bluhm et al. |
| 5,652,584 A | 7/1997 | Yoon |
| 5,835,967 A | 11/1998 | McMahan |
| 6,131,104 A | * 10/2000 | Oberman ..................... 708/204 |
| 6,282,554 B1 | * 8/2001 | Abdallah et al. ........... 708/204 |
| 6,292,815 B1 | * 9/2001 | Abdallah et al. ........... 708/204 |

OTHER PUBLICATIONS

Suzuki, et al., in "Leading–Zero Anticipatory Logic for High–Speed Floating Point Addition", IEEE Journal of Solid–State Circuits, vol. 31, No. 8, Aug. 1996.
Hokenek and Montoye in "Leading–zero Anticipator (LZA) in the IBM RISC System/6000 Floating–point Execution Unit", IBM J. Res. Develop., vol. 34, No. 1, Jan. 1990.

* cited by examiner

*Primary Examiner*—Tan V. Mai

(57) ABSTRACT

For use in a processor having a floating point execution core, logic circuitry for, and a method of, converting negative numbers from integer notation to floating point notation. In one embodiment, the logic circuitry includes: (1) a one's complementer that receives a number in integer notation and inverts the received number to yield an inverted number, (2) a leading bit counter, coupled to the one's complementer, that counts leading bits in the inverted number to yield leading bit data, (3) a shifter, coupled to the one's complementer and the leading bit counter, that normalizes the inverted number based on the leading bit data to yield a shifted inverted number, (4) an adder, coupled to the shifter, that increments the shifted inverted number to yield a fractional portion of the received number in floating point notation and overflow data, the adder renormalizing the fractional portion based on the overflow data and (5) exponent generating circuitry, coupled to the leading bit counter and the adder, that generates an exponent portion of the received number in floating point notation as a function of the leading bit data and the overflow data.

20 Claims, 5 Drawing Sheets

INTEGER TO FLOATING POINT CONVERSION USING ONE'S COMPLEMENT WITH SUBSEQUENT CORRECTION TO ELIMINATE TWO'S COMPLEMENT IN CRITICAL PATH

CROSS-REFERENCES TO RELATED APPLICATIONS

This patent application is related to commonly assigned and contemporaneously filed U.S. patent applications Ser. No. 09/377,683 entitled "ROUNDING DENORMALIZED NUMBERS IN A PIPELINED FLOATING POINT UNIT WITHOUT PIPELINE STALLS"; Ser. No. 09/377,140 entitled "FORMATTING DENORMAL NUMBERS FOR PROCESSING IN A PIPELINED FLOATING POINT UNIT" Ser. No. 09/377,099 entitled "CONVERTING NEGATIVE FLOATING POINT NUMBERS TO INTEGER NOTATION WITHOUT TWO'S COMPLEMENT HARDWARE" and Ser. No. 09/377,139 entitled "LEADING BIT PREDICTION WITH IN-PARALLEL CORRECTION", all of which are herein incorporated by reference.

TECHNICAL FIELD OF THE INVENTION

The present invention is directed, in general, to microprocessors and, more particularly, to a processor architecture employing an improved floating point unit (FPU).

BACKGROUND OF THE INVENTION

The ever-growing requirement for high performance computers demands that computer hardware architectures maximize software performance. Conventional computer architectures are made up of three primary components: (1) a processor, (2) a system memory and (3) one or more input/output devices. The processor controls the system memory and the input/output ("I/O") devices. The system memory stores not only data, but also instructions that the processor is capable of retrieving and executing to cause the computer to perform one or more desired processes or functions.

The I/O devices are operative to interact with a user through a graphical user interface ("GUI") (such as provided by Microsoft Windows™ or IBM OS/2™), a network portal device, a printer, a mouse or other conventional device for facilitating interaction between the user and the computer.

Over the years, the quest for ever-increasing processing speeds has followed different directions. One approach to improve computer performance is to increase the rate of the clock that drives the processor. As the clock rate increases, however, the processor's power consumption and temperature also increase. Increased power consumption is expensive and high circuit temperatures may damage the processor. Further, the processor clock rate may not increase beyond a threshold physical speed at which signals may traverse the processor. Simply stated, there is a practical maximum to the clock rate that is acceptable to conventional processors.

An alternate approach to improve computer performance is to increase the number of instructions executed per clock cycle by the processor ("processor throughput"). One technique for increasing processor throughput is pipelining, which calls for the processor to be divided into separate processing stages (collectively termed a "pipeline"). Instructions are processed in an "assembly line" fashion in the processing stages. Each processing stage is optimized to perform a particular processing function, thereby causing the processor as a whole to become faster.

"Superpipelining" extends the pipelining concept further by allowing the simultaneous processing of multiple instructions in the pipeline. Consider, as an example, a processor in which each instruction executes in six stages, each stage requiring a single clock cycle to perform its function. Six separate instructions can therefore be processed concurrently in the pipeline; i.e., the processing of one instruction is completed during each clock cycle. The instruction throughput of an n-stage pipelined architecture is therefore, in theory, n times greater than the throughput of a non-pipelined architecture capable of completing only one instruction every n clock cycles.

Another technique for increasing overall processor speed is "superscalar" processing. Superscalar processing calls for multiple instructions to be processed per clock cycle. Assuming that instructions are independent of one another (the execution of each instruction does not depend upon the execution of any other instruction), processor throughput is increased in proportion to the number of instructions processed per clock cycle ("degree of scalability"). If, for example, a particular processor architecture is superscalar to degree three (i.e., three instructions are processed during each clock cycle), the instruction throughput of the processor is theoretically tripled.

These techniques are not mutually exclusive; processors may be both superpipelined and superscalar. However, operation of such processors in practice is often far from ideal, as instructions tend to depend upon one another and are also often not executed efficiently within the pipeline stages. In actual operation, instructions often require varying amounts of processor resources, creating interruptions ("bubbles" or "stalls") in the flow of instructions through the pipeline. Consequently, while superpipelining and superscalar techniques do increase throughput, the actual throughput of the processor ultimately depends upon the particular instructions processed during a given period of time and the particular implementation of the processor's architecture.

The speed at which a processor can perform a desired task is also a function of the number of instructions required to code the task. A processor may require one or many clock cycles to execute a particular instruction. Thus, in order to enhance the speed at which a processor can perform a desired task, both the number of instructions used to code the task as well as the number of clock cycles required to execute each instruction should be minimized.

Statistically, certain instructions are executed more frequently than others. If the design of a processor is optimized to rapidly process the instructions that occur most frequently, then the overall throughput of the processor can be increased. Unfortunately, the optimization of a processor for certain frequent instructions is usually obtained only at the expense of other less frequent instructions, or requires additional circuitry, which increases the size of the processor.

As computer programs have become increasingly more graphic-oriented, processors have had to deal more and more with the conversion between integer and floating point representations of numbers. Thus, to enhance the throughput of a processor that must generate data necessary to represent graphical images, it is desirable to optimize the processor to efficiently convert between integer and floating point representations of data.

U.S. Pat. No. 5,257,215 to Poon, issued Oct. 26, 1993, describes a circuit and method for the performing integer to floating point conversions in a floating point unit. The method disclosed, however, requires a two's complement operation for the conversion of negative numbers; a two's complement operation requires additional clock cycles and is thus undesirable if the throughput of the floating point unit is to be optimized.

To address the above-discussed deficiencies of the prior art, it is a primary object of the present invention to provide an efficient system and method for converting numbers from integer notation to floating point notation and a computer system employing the same. Preferably, the optimization of the processor should not require any additional hardware or degrade the performance of the processor in performing tasks other than integer to floating point conversions; in particular, the conversion of negative numbers should not require the performance of a two's complement operation.

SUMMARY OF THE INVENTION

In the attainment of the above primary object, the present invention provides, for use in a processor having a floating point execution core, logic circuitry for, and a method of, converting negative numbers from integer notation to floating point notation. In one embodiment, the logic circuitry includes: (1) a one's complementer that receives a number in integer notation and inverts the received number to yield an inverted number, (2) a leading bit counter, coupled to the one's complementer, that counts leading bits in the inverted number to yield leading bit data, (3) a shifter, coupled to the one's complementer and the leading bit counter, that normalizes the inverted number based on the leading bit data to yield a shifted inverted number, (4) an adder, coupled to the shifter, that increments the shifted inverted number to yield a fractional portion of the received number in floating point notation and overflow data, the adder renormalizing the fractional portion based on the overflow data and (5) exponent generating circuitry, coupled to the leading bit counter and the adder, that generates an exponent portion of the received number in floating point notation as a function of the leading bit data and the overflow data.

The present invention therefore fundamentally reorders the process by which numbers are converted from integer to floating point notation to allow such numbers to be converted in a pipelined process. The present invention is founded on the novel realization that one's complementing (a part of the two's complementing process required in converting negative numbers) can be allowed to occur before normalization (shifting). The present invention is therefore particularly suited to floating point units ("FPUs") having a pipelined load converter and adder, as the hardware already present in the converter and adder can be employed to perform integer to floating point conversion.

In one embodiment of the present invention, the logic circuitry further includes a multiplexer, interposed between the one's complementer and the shifter, that selects one of the received number and the inverted number based on a sign of the received number. Thus, the present invention can be adapted for use in additionally converting positive numbers. Positive numbers have no need to be two's complemented during conversion. Therefore, in this embodiment, steps are taken to bypass the one's complementing to which negative numbers are subjected.

In one embodiment of the present invention, the exponent generating circuitry comprises a bias converter that generates an uncompensated biased exponent, the exponent generating circuitry adjusting the uncompensated biased exponent as a function of the leading bit data and the overflow data to yield the exponent portion. Those skilled in the art are familiar with the manner in which exponents are biased or unbiased during notation conversion. In this embodiment, the present invention enhances the bias process by further adjusting for any "overguessing" that may occur in the adder.

In one embodiment of the present invention, the leading bit counter counts a number of leading zeroes in the inverted number. Alternatively, leading ones in the received (uninverted number) may be counted. Those skilled in the art are familiar with conventional normalization processes in which integers are shifted and thereby normalized.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
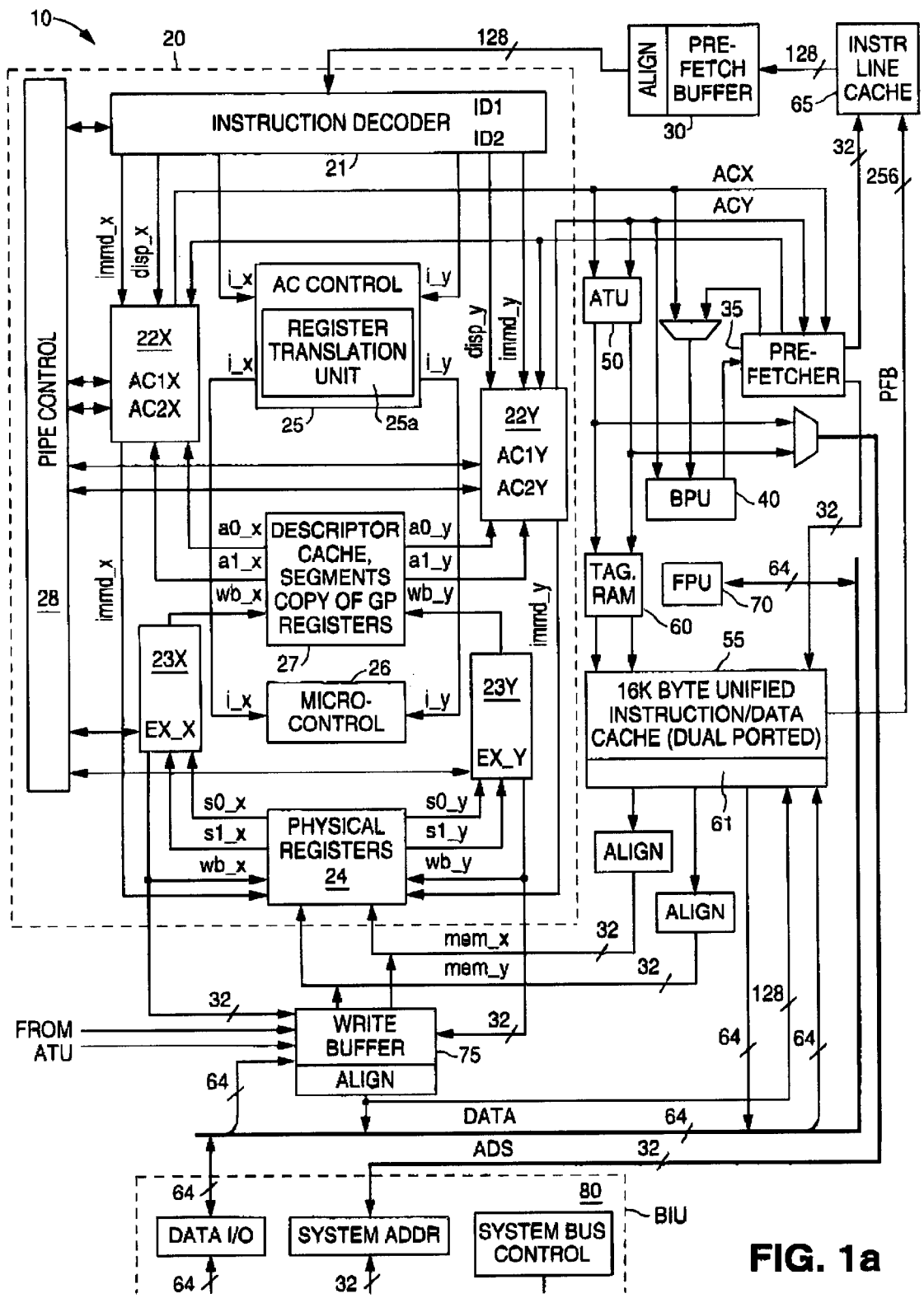
FIG. 1a illustrates a block diagram of an exemplary superscalar and superpipelined processor in accordance with the principles of the present invention.

Referring initially to FIG. 1a, illustrated is a block diagram of an exemplary superscalar and superpipelined processor 10 in accordance with the principles of the present invention. Exemplary processor 10 includes a processor core 20, a prefetch buffer 30, a prefetcher 35, a branch processing unit ("BPU") 40, an address translation unit ("ATU") 50, a unified cache 55, TAG random access memory ("TAG RAM") 60, an instruction line cache 65, an onboard floating point unit ("FPU") 70, a plurality of write buffers 75 (one shown), and a bus interface unit ("BIU") 80. Each of the above-identified components is conventional, i.e., their functionality is known. The functionality associated with the interrelationship of various ones of the components is also known. Exemplary processors implementing the foregoing are the 6x86 and MII processors available from Cyrix Corporation of Richardson, Tex.

In an exemplary embodiment, instruction line cache 65 and unified cache 55 operate as primary and secondary instruction caches, respectively, each having a 32 byte line size. This implementation reduces instruction fetches to unified cache 55. In a preferred embodiment, instruction line cache 65 may be a 256 byte cache, while unified cache 55 maybe a 16 kilobyte ("Kbyte") code/data cache. Unified cache 55 may also be associated with TAG RAM 60. In another exemplary embodiment, processor 10 may use a 32-bit address bus ("ADS"), a 64-bit data bus ("DATA") and a 256 bit pre-fetch bus ("PFB"). The PFB corresponds to the 32 byte line sizes of unified cache 55 and instruction line cache 65, and enables a full line of 32 instruction bytes to be transferred to instruction line cache 65 in a single clock cycle. Unified cache 55 is preferably 4-way set associative, using a pseudo-least-recently-used ("LRU") replacement algorithm, with selectively alternative write-through and write-back modes. Unified cache 55 is multi-ported (through banking) to permit two memory accesses (e.g., data reads, instruction fetches or data writes) per clock cycle. Instruction line cache 65 is preferably a fully associative, look-aside implementation (relative to the unified cache 55), using an LRU replacement algorithm.

Turning momentarily to exemplary processor core 20, illustrated is a superscalar and superpipelined design having two exemplary execution pipelines, designated X and Y, and including an instruction decode ("ID") stage 21, two address calculation/operand access ("AC") stages, 22X and 22Y, two execution ("EX") stages, 23X and 23Y, and a register file 24 having 31 32-bit registers. Core 20 further includes an AC control stage 25, a microcontrol unit 26, a pipe control unit 28, and a second register file 27 containing a descriptor cache, segment registers and a copy of the logical general purpose registers.

Exemplary ID stage 21 is operative to decode a variable length x86-based instruction set, and may retrieve 16 bytes of instruction data from pre-fetch buffer 30 each clock cycle. Exemplary AC stages 22X and 22Y are each operative to perform address calculations for their respective execution pipelines. Exemplary EX stages 23X and 23Y are each operative to execute instructions within their respective execution pipelines. Exemplary register file 24 includes 31 physical registers.

Exemplary AC control stage 25, which includes a register translation unit 25a, and may further include appropriately arranged register renaming hardware (not shown), is operative to control address calculations. Exemplary microcontrol unit 26, 30 which may include a micro-sequencer (not shown) and a micro-ROM (not shown), provides execution control. Again, exemplary second register file 27 may include a descriptor cache, segment registers and a copy of the logical general purpose registers (i.e., as obtained from register file 24). Exemplary pipe control unit 28 is operative to control instruction flow through exemplary execution pipelines X and Y, whereby instruction order is maintained until pipe control unit 28 determines that a particular instruction will not cause an exception.

In an exemplary embodiment, register translation unit 25a has a capacity to map 32 physical registers to 8 logical registers. In the illustrated embodiment however, processor 10 includes only 31 physical registers, leaving register translation unit 25a with excess mapping capacity. Processor 10 may use the excess mapping capacity by allowing register translation unit 25a to map to a physical register other than those located in register file 24. In the illustrated embodiment, the physical register may be located in second register file 27, which is under control of AC control unit 25. In an alternate exemplary embodiment, pipe control unit 28 is further operative to remove bubbles from the instruction stream, i.e., "flushing" the execution pipelines behind branches that are mis-predicted and handling the execution of exception-causing instructions.

More particularly, BPU 40 monitors speculative execution associated with branches or floating point instructions (i.e., execution of instructions speculatively issued after branches that may be mis-predicted or floating point instructions issued to FPU 70 that may fault after execution of speculatively-issued instructions). In the event that a branch is mis-predicted (a condition not known until the instruction reaches one of the execution or write-back stages for the branch) or a floating point instruction faults, the execution pipeline is repaired to the point of the mis-predicted or faulting instruction (i.e., the execution pipeline is "flushed" behind the instruction) and an associated instruction fetch is restarted. Pipeline repair is preferably accomplished by creating processor state checkpoints at each pipeline stage as a predicted branch or floating point instruction enters the same. For these check pointed instructions, all processor resources (e.g., programmer-visible registers, the instruction pointer and the condition code register) that may be modified by succeeding speculatively-issued instructions are check pointed. If a check pointed branch is mis-predicted or a check pointed floating point instruction faults, the execution pipeline is flushed behind the check pointed instruction. In the case of floating point instructions, this typically results in the entire execution pipeline being flushed. However, for a mis-predicted branch, there may be a paired instruction in EX and two instructions in WB that are nonetheless allowed to complete.

In accordance with the illustrated embodiment, writes from processor core 20 may be queued into write buffer 75. Write buffer 75 provides an interface for writes to unified cache 55, while non-cacheable writes proceed directly from write buffer 75 to an external memory (shown and described in conjunction with FIG. 2). Write buffer logic may support optional read sourcing and write gathering. In an exemplary embodiment, write buffer 75 includes twelve 32-bit write buffers, and write buffer allocation is performed by AC control unit 25.

FPU 70 includes a load/store stage with 4-deep load and store queues, a conversion stage (32-bit to 80-bit extended format), and an execution stage. Loads are controlled by processor core 20, and cacheable stores are directed through write buffer 75 (i.e., write buffer 75 is preferably allocated for each floating point store operation).

Figure 1B:
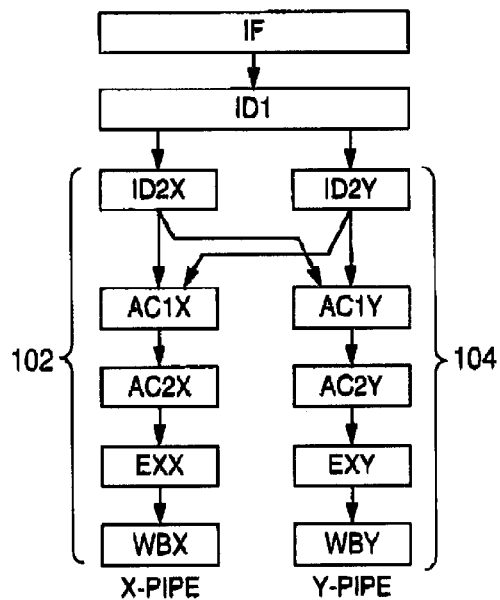
FIG. 1b illustrates a block diagram of seven exemplary pipelined stages of the processor of FIG. 1a, including X and Y execution pipelines.

Turning to FIG. 1b, illustrated is a block diagram of seven exemplary pipelined stages of processor 10 of FIG. 1a, including X and Y execution pipelines. As before, each of the X and Y execution pipelines includes IF, ID1, ID2, AC1, AC2, EX and WB stages. Exemplary IF stage provides a continuous instruction code stream into processor core 20. Prefetcher 35 is operative to fetch 16 bytes of instruction data into prefetch buffer 30 from either instruction line cache 65 or unified cache 55. BPU 40 is accessed with the prefetch address, and supplies target addresses to prefetcher 35 for predicted changes of flow, allowing prefetcher 35 to shift to a new code stream in a single clock cycle.

Exemplary decode stages ID1 and ID2 decode a variable length x86-based instruction set. Instruction decoder 21 retrieves 16 bytes of instruction data from prefetch buffer 30 each clock cycle. In ID1, the length of two instructions is decoded (one each for the X and Y execution pipelines) to obtain X and Y instruction pointers, a corresponding X and Y bytes-used signal is returned to prefetch buffer 30 which subsequently increments for the next 16 byte transfer. Also in ID1, certain instruction types are determined, such as changes of flow, and immediate or displacement operands are separated. In ID2, the decoding of X and Y instructions is completed, generating entry points for "microROM" and decoding addressing modes and register fields.

The optimum pipeline, X or Y, for executing an instruction is determined during the ID stages, causing the instruction to be issued into that pipeline. In an exemplary embodiment, circuitry is provided for pipeline switching which enables instructions to be switched from ID2X to AC1Y and from ID2Y to AC1X, as certain instructions (e.g., change of flow, floating point, exclusive or other like instructions) may only be issued in one of the two pipelines.

"Exclusive instructions" as the phrase is used herein, include any instructions that may fault within the EX pipeline stage, as well as certain instruction types, such as protected mode segment loads, string, special register access (control, debug, test, etc.), Multiply/Divide, Input/Output, PUSHA/POPA (PUSH all/POP all), task switch and the like. Exclusive instructions may use the resources of both execution pipelines; exclusive instructions are preferably issued alone from the ID stage.

Exemplary address calculation stages AC1 and AC2 calculate addresses for memory references and supply memory operands. During AC1 two 32 bit linear (three operand) addresses are preferably calculated per clock cycle. Data dependencies are checked and resolved using register translation unit 25a and the 31 physical registers in register file 24 are advantageously used to map eight general purpose, programmer-visible logical registers in accordance with x86-based architecture, namely: EAX, EBX, ECX, EDX, EDI, ESI, EBP and ESP. During AC2, register file 24 and unified cache 55 are accessed with the physical address. For cache hits, cache access time for multi-ported, unified cache 55 is the same as that of a register, effectively extending the register set. The physical address is either the linear address, or if address translation is enabled, a translated address generated by ATU 50.

The AC stage preferably includes eight logical, or architectural, registers, representing the x86-based register set. In a preferred embodiment, the logical register corresponding to the stackpointer ("ESP") contains the actual stackpointer (instead of simply a copy thereof) when control of the stackpointer is allocated to AC1. If an instruction requires one or more address calculations, AC1 is operative to wait until the required data of the logical registers are valid before accessing those registers. During AC2, operands are obtained by accessing register file 24 and unified cache 55 with the physical address. The physical address therefore is preferably either the linear address or, if address translation is enabled, a translated address generated by ATU 50.

Exemplary ATU 50 is operative to generate translated addresses, preferably using a translation lookaside buffer ("TLB") or the like, from the linear address using information from page tables in memory and local workspace control registers. Unified cache 55 is virtually indexed and physically tagged to permit, when address translation is enabled, set selection with the un-translated address (available at the end of AC1) and, for each set, tag comparison with the translated address from ATU 50 (available early in AC2). In the illustrated embodiment, segmentation or address translation violation checks are performed in AC2.

Instructions within a given instruction code stream are preferably kept in order until it is determined that out-of-order execution of the same will not cause an exception. This determination may be made during or before AC2, although floating point and certain exclusive instructions may cause exceptions during execution. Instructions are passed from AC2 to EX (floating point instructions are passed to FPU 70). Instructions spend a variable number of clock cycles in EX as many of the same may execute out of order. Integer instructions may cause exceptions in EX and are therefore designated as exclusive and issued alone into both execution pipelines, thereby ensuring that exceptions are handled in order.

Exemplary execution stages EX X and EX Y perform the operations defined by a given instruction using one or more adders, multiplexers, shifters, or other functional units. The EX X execution stage may also include multiplication and division hardware.

Exemplary write back stage ("WB") updates register file 24, condition codes, as well as other parts of an associated processing system with the results of the previously executed instruction. Typically, register file 24 is written in phase 1 ("PH1") of WB and read in phase 2 ("PH2") of AC2.

Additional disclosure of write buffers 75, speculative execution and the microsequencer may be found in U.S. Pat. No. 5,584,009 entitled "System And Method Of Retiring Store Data From A Write Buffer"; U.S. Pat. No. 5,835,967 entitled "Adjusting Prefetch Size Based On Source Of Prefetch Address"; and U.S. Pat. No. 5,644,741 entitled "Processor With Single Clock Decode Architecture Employing Single MicroROM", all of which are commonly assigned to the Assignee of the present invention and are herein incorporated by reference.

Figure 2:
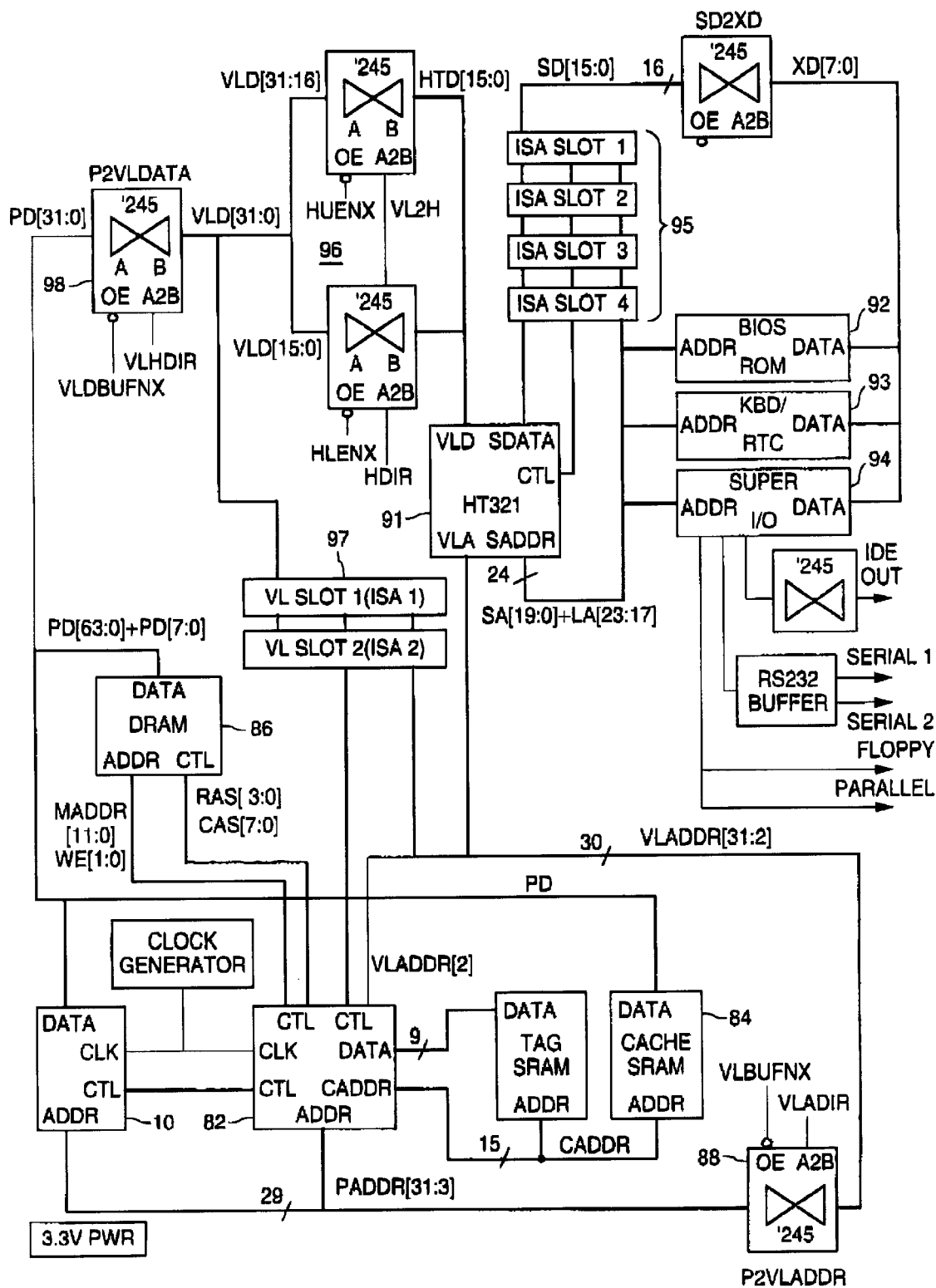
FIG. 2 illustrates a block diagram of an exemplary processor system incorporating the processor of FIGS. 1a and 1b.

Turning to FIG. 2, illustrated is an exemplary processor system design, in the form of a motherboard that advantageously employs exemplary processor 10 of FIGS. 1a and 1b in cooperation with a single chip memory/bus controller 82. Controller 82 provides an interface between processor 10 and an external memory subsystem controlling data movement over the 64-bit processor data bus. The external memory subsystem includes level two cache 84 and main memory 86. In accordance with the illustrated embodiment, the data path may be external to controller 82 thereby reducing its pin count and cost.

Controller 82 preferably interfaces with ADS, the 32-bit address bus, directly and includes a one bit wide data port (not shown) for reading and writing registers within controller 82. A bidirectional isolation buffer 88 is preferably provided as an address interface between processor 10 and a conventional video local bus ("VL-Bus") and a conventional industry standard architecture ("ISA") bus. Controller 82 provides control for VL-Bus and ISA bus interfaces. A VL/ISA interface chip 91 provides standard interfaces to an exemplary 32-bit VL-Bus and an exemplary 16-bit ISA bus. The ISA bus may interface to a basic input/output system ("BIOS") 92, a keyboard controller 93, and an I/O chip 94, as well as standard ISA slots 95. The interface chip 91 preferably interfaces to the 32-bit VL-bus through a bidirectional 32/16 multiplexer 96 formed by multiple high/low word isolation buffers. The VL-Bus interfaces to standard VL-Bus slots 97 and, through a bidirectional isolation buffer 98, to the low double word of PD.

Figure 3:
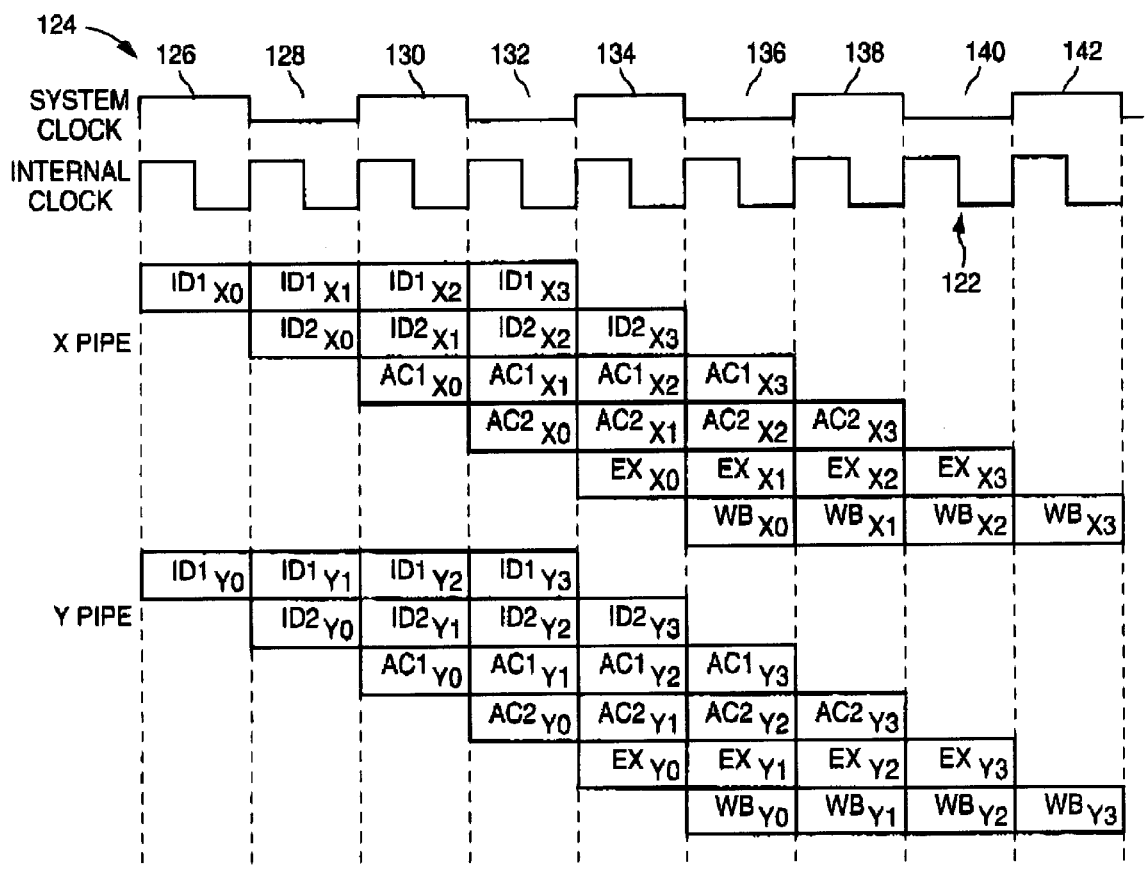
FIG. 3 illustrates an exemplary timing diagram demonstrating the flow of instructions through a pipeline in accordance with the exemplary processor of FIGS. 1a through 2.

Turning to FIG. 3, illustrated is an exemplary timing diagram demonstrating the flow of instructions through a pipeline of processor 10 of FIGS. 1a and 2. The timing diagram illustrates the flow of eight instructions through the pipeline, showing overlapping execution of instructions for a two pipeline architecture. Processor 10 preferably uses an internal clock 122 that is a multiple of a system clock 124. In the illustrated embodiment, internal clock 122 operates at twice the frequency of system clock 124.

During a first internal clock cycle 126, the ID1 stage operates respectively on instructions X0 and Y0. During internal clock cycle 128, instructions X0 and Y0 are in the ID2 stage (X0 being in ID2X and Y0 being in ID2Y) and instructions X1 and Y1 are in the ID1 stage. During internal clock cycle 130, instructions X2 and Y2 are in the ID1 stage, instructions X1 and Y1 are in the ID2 stage (X1 being in ID2X and Y1 being in ID2Y) and instructions X0 and Y0 are in the AC1 stage (X0 being in AC1X and Y0 being in AC1Y). During internal clock cycle 132, instructions X3 and Y3 are in the ID1 stage, instructions X2 and Y2 are in the ID2 stage, instructions X1 and Y1 are in the AC1 stage and instructions X0 and Y0 are in the AC2 stage.

The execution portion of each of the foregoing instructions is performed during sequential clock cycles, namely, clock cycles 134 to 140. This is an important aspect a pipelined architecture as the total instructions completed per clock cycle increases without reducing the execution time of individual instructions. Greater instruction throughput is thereby achieved without requiring greater demands on the speed of the hardware.

It should be noted that FIG. 3 illustrates an optimum condition, as no stage requires more than a single clock cycle. In actuality, however, one or more stages may require additional clock cycles for completion, thereby changing instruction flow through the other pipeline stages. Further, instruction flow through one pipeline may depend upon the flow of other instructions in the same or the other pipeline.

Figure 4:
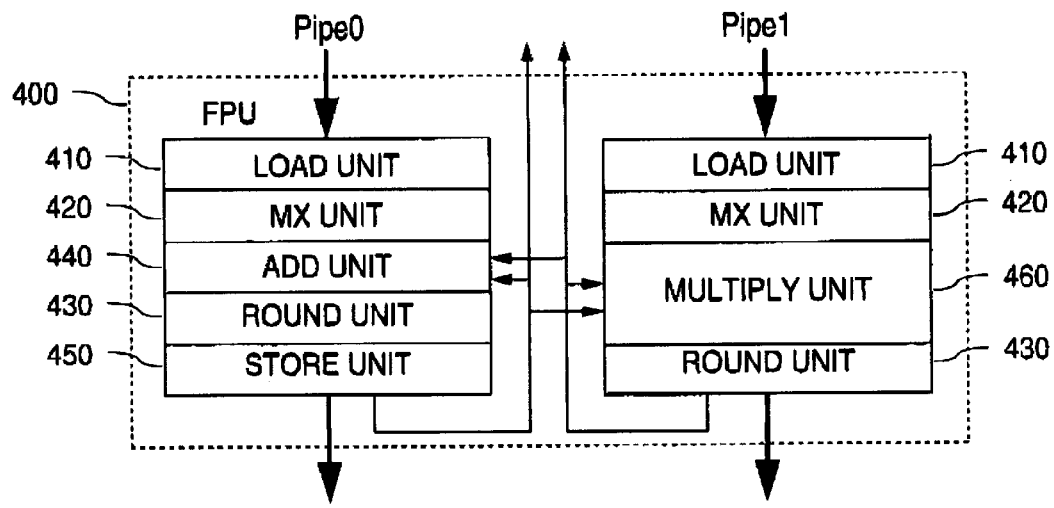
FIG. 4 illustrates an exemplary pipelined floating point unit ("FPU") adaptable to employ the principles of the present invention.

The focus of the present invention is directed to optimizing the operation of FPU 70 in the conversion of numbers from integer to floating point notation. FIG. 4 illustrates an exemplary pipelined FPU 400 adaptable to employ the principles of the present invention. In the embodiment illustrated, the FPU 400 is designed to be non-symmetric superscalar, which allows for maximum throughput without excessive duplication of execution resources. The exemplary FPU 400 has two pipes, Pipe0 and Pipe1, each having a load unit 410, a multi-media extensions ("MX") unit 420, and a round unit 430. Pipe0 further includes an add unit 440 and a store unit 450, and Pipe1 further includes a multiply unit 460. Although the exemplary architecture of FPU 400 may be adapted to employ the principles of the present invention, the present invention is not limited to a specific FPU architecture. From the description hereinafter, those skilled in the art will readily conceive of the means and advantages of employing the system and method disclosed herein for converting numbers from integer notation to floating point notation.

In one embodiment, the load unit 410 is operative to read operands from an operand queue (not shown) and convert them from a memory format to a format suitable for use within the FPU 400; for example, the load conversion may consist of reading an operand from the operand queue and converting it from a memory format to an internal floating-point format. Memory operands can have several formats, including 16-bit integer, 32-bit integer, and 64-bit integer. A conventional, straight-forward method of converting a number in integer notation to floating point notation, ignoring the handling of "0", includes the following steps:

1. Unpack the magnitude of the integer into a 64-bit mantissa representation, with the integer left-aligned with the most significant bit ("MSB") of the internal floating-point format, appending "0"s as necessary.
2. Extract the sign bit from the most significant bit of the data type.
3. Set the exponent of the floating-point number to BIAS+15 if the number is a 16-bit integer, BIAS+31 if the number is a 32-bit integer, or BIAS+63 if the number is a 64-bit integer. Generally, BIAS is selected such that all values in the representation are positive, and the binary representation is unsigned, and such that BIAS is usually in the middle of the range, which typically results in an equal number of positive and negative representations.
4. Perform a two's complement operation on the extracted mantissa for use if the sign is negative.
5. Select the appropriate mantissa, either the complement or non-complemented mantissa, based on the sign of the mantissa.
6. Count the number of leading zeroes in the intermediate significand following step 5; subtract the number from the intermediate exponent (from step 3) and logically shift the intermediate significand (from step 5) left by the same amount, shifting in "0"s.

Because a conventional load unit includes the normalization capability for denormal numbers, the load unit 410 has the capability to perform the conversion of a memory operand from integer to floating-point notation, except that it lacks the capability to perform the two's complement operation required in step 4. The present invention is premised on the novel observation that the foregoing method will produce the correct integer to floating-point conversion if step 4 is changed from a two's complement operation to a one's complement operation prior to normalization, provided that the increment is still performed after step 5 except in those cases where the original operand was negative and consists of a string of one or more "1's" followed by at least one "0". In such cases, the normalization count will be an "overguess" and high by 1, requiring a correction step. The novel method includes the following steps:

1. Initialize the sign from the sign of the memory return as a function of the size.
2. Initialize the exponent to the internal bias plus the size, which is the binary weight of the most significant data bit position in the memory return.; i.e., set the exponent of the floating-point number to BIAS+15 if the number is a 16-bit integer, BIAS+31 if the number is a 32-bit integer, or BIAS+63 if the number is a 64-bit integer.
3. Initialize the significand from the memory return such that the bit after the sign in the return is in the leading bit position and A0's@ are appended after the memory return.
4. If the sign is negative, ones complement the intermediate significand from step 3.
5. Count the number of leading zeros in the intermediate significand, following step 4; subtract this number from the intermediate exponent derived in step 2, and logically shift the intermediate significand left by this number of bits while shifting in the sign.
6. If the sign is negative, increment the intermediate significand at the least-significant bit ("LSB") position.
7. If the sign is negative and an "overguess" occurred in step 4, adjust the intermediate exponent and significand.

The shifting in of the sign in step 5 is required to cause the increment at the LSB in step 6 to propagate to the correct bit position to complete the two's complement operation. In the specific embodiment disclosed herein, steps 1–5 are preferably performed in the load unit 410, while steps 6 and 7 are performed in the adder unit 440.

Those skilled in the art will recognize that steps 1 through 6 of the foregoing method will function properly for positive numbers, since no inversion or correction is required; in addition, the method will also work correctly for the conversion of an integer "0", assuming that the load unit 410 correctly deals with integer loads of all "0's" (including any TAG data) prior to the add unit 440. The conversion of negative integers, however, may require the corrective step 7.

First, examine a negative integer load which requires no correction for step 4, using a 16-bit integer which has 15-bits of significance (using '.' to set the leading bit of the significand off from the fraction bits). Table 1 illustrates the values of the unbiased exponent, significand and leading zero count ("LZC") after each step in the method, for an operand equal to −3. The floating point result is equal to (sign)×($2^{unbiased\ exponent}$)×significand, which, for the conversion example in Table 1, correctly resulted in the value of the integer operand.

TABLE 1

| | 16'b1111_1111_1111_1101 | | | |
|---|---|---|---|---|
| Operand = −3 | sign | unbiased exponent | significand | LZC |
| after step 3 | 1 | 14 | 1.11_1111_1111_1101_0 . . . 0 | |
| after step 4 | 1 | 14 | 0.00_0000_0000_0010_1 . . . 1 | 13 |
| after step 5 | 1 | 1 | 1.01_1111_1111_1111_1 . . . 1 | |
| after step 6 | 1 | 1 | 1.10_0000_0000_0000_0 . . . 0 | |
| after step 7 | 1 | 1 | 1.10_0000_0000_0000_0 . . . 0 | |
| result = (−1) * (2^1) * 1.5 = −3 | | | | |

Table 2 illustrates an example requiring a correction for step 4. In the example illustrated in Table 2, the need for correction is indicated by the carry out from the increment in step 6 (in front of the '.'), which is corrected just like any carry out from an addition; i.e., the exponent is incremented and the significand is right shifted by 1. All cases of operands conforming to the regular expression A1+0+@ will result in intermediate significands of the form "0+1+" after step 4, which are normalized to all "1's" after step 5, resulting in a carry out in step 6, which requires a corresponding adjustment in step 7.

TABLE 2

| | 16'b1111_1111_1111_1111 | | | |
|---|---|---|---|---|
| Operand = −2 | sign | unbiased exponent | significand | LZC |
| after step 3 | 1 | 14 | 1.11_1111_1111_1111_0 . . . 0 | |
| after step 4 | 1 | 14 | 0.00_0000_0000_0001_1 . . . 1 | 14 |
| after step 5 | 1 | 0 | 1.11_1111_1111_1111_1 . . . 1 | |
| after step 6 | 1 | 0 | 1, 0.00_0000_0000_0000_0 . . . 0 | |

TABLE 2-continued

| | 16'b1111_1111_1111_1111 | | | |
|---|---|---|---|---|
| Operand = −2 | sign | unbiased exponent | significand | LZC |
| after step 6 | 1 | 1 | 1.00_0000_0000_0000_0 . . . 0 | |
| after step 7 | | | | |
| result = (−1) * (2^1) * 1.0 = −2 | | | | |

Finally, Table 3 illustrates the remaining case where the operand is equal to "−1". As can be seen, the method of steps 1 through 7 also works for the conversion example in Table 3, correctly resulting in the value of the integer operand.

TABLE 3

| | 16'b1111_1111_1111_1111 | | | |
|---|---|---|---|---|
| Operand = −1 | sign | unbiased exponent | Significand | LZC |
| after step 3 | 1 | 14 | 1.11_1111_1111_1111_0 . . . 0 | |
| after step 4 | 1 | 14 | 0.00_0000_0000_0000_1 . . . 1 | 15 |
| after step 5 | 1 | −1 | 1.11_1111_1111_1111_1 . . . 1 | |
| after step 6 | 1 | −1 | 1, 0.00_0000_0000_0000_0 . . . 0 | |
| after step 7 | 1 | 0 | 1.00_0000_0000_0000_0 . . . 0 | |
| result = (−1) * (2^1) * 1.0 = −1 | | | | |

For the exemplary architecture of the FPU 400, the implementation of the method of steps 1–7 is handled by the load unit 410 and add unit 440 as follows:

1. Using the load unit 410, perform an integer load conversion of size 16, 32, or 64:
   1.1) Initialize the sign from the sign of the memory return as a function of the size.
   1.2) Initialize the exponent to the internal bias plus the size, which is the binary weight of the most significant data bit position in the memory return.; i.e., set the exponent of the floating-point number to BIAS+15 if the number is a 16-bit integer, BIAS+31 if the number is a 32-bit integer, or BIAS+63 if the number is a 64-bit integer.
   1.3) Initialize the significand from the memory return such that the bit after the sign in the return is in the leading bit position and "0's" are appended after the memory return.
   1.4) If the sign is negative, one's complement the intermediate significand from step 3.
   1.5) Count the number of leading zeros in the intermediate significand, following step 4; subtract this number from the intermediate exponent derived in step 2, and logically shift the intermediate significand left by this number of bits while shifting in the sign.
2. Chain the result of the load conversion to an addition in adder unit 440, with the other operand being 0.0 and a minor opcode indicating that it is the second half of an integer load conversion:
   2.1) If the sign is negative, increment the intermediate significand at the LSB position.
   2.2) Handle an increment overflow the same as an overflow from an addition operation by incrementing the exponent and right shifting the significand to correct for "overguesses" of the normalization count in step 1.4.

Figure 5:
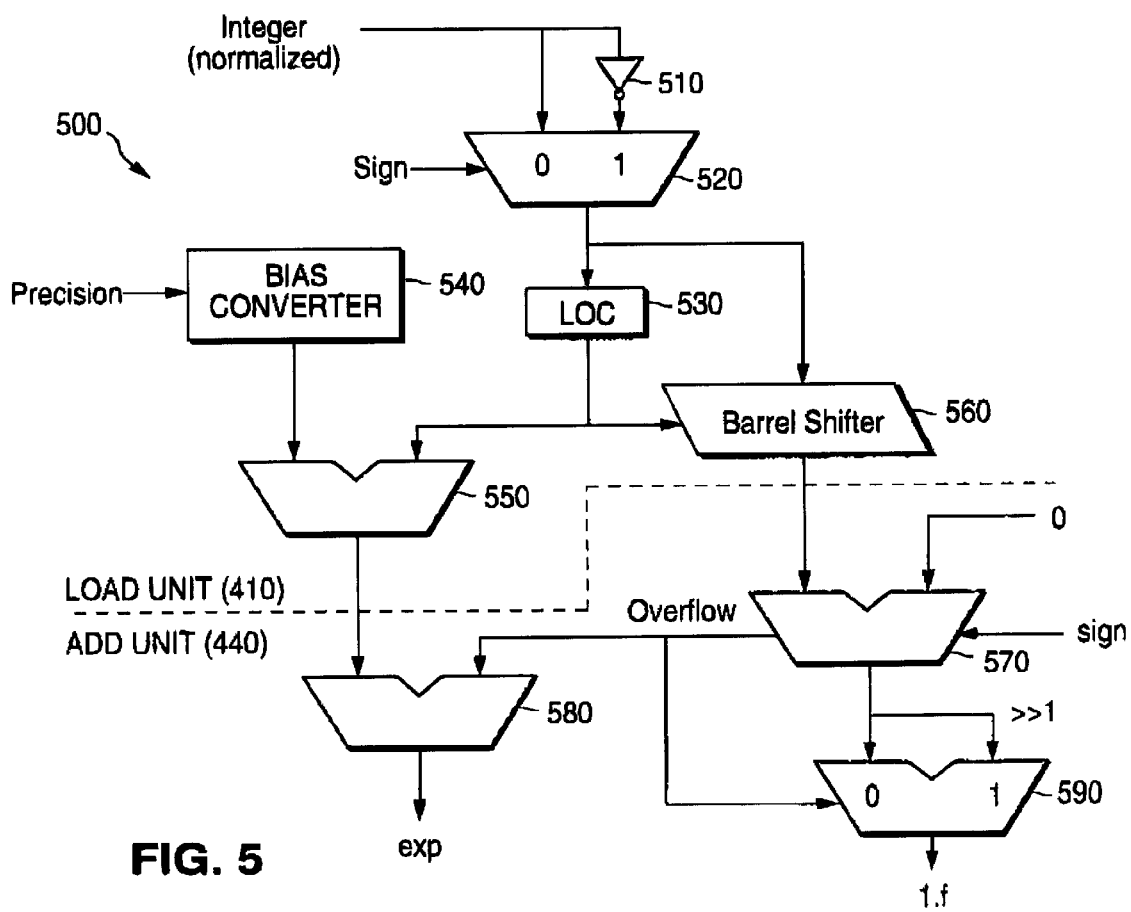
FIG. 5 illustrates an exemplary embodiment of an integer to floating point conversion circuit, according to the principles of the present invention, which overcomes the disadvantages of conventional integer to floating point conversion circuits and methods.

Turning now to FIG. 5, illustrated is an exemplary embodiment of an integer to floating point conversion circuit 500, according to the principles of the present invention, which overcomes the disadvantages of conventional integer to floating point conversion circuits and methods. The conversion circuit 500 includes logical circuits which, in the embodiment illustrated, are distributed between a load unit 410 and an add unit 440 in the exemplary FPU 400. The input to the conversion circuit 500 is an integer; it is assumed that the integer has been normalized, as described hereinabove, i.e., the input is the "intermediate significand" from step 1.3.

The step 1.4 of the above-described method is performed with an inverter 510 and multiplexer 520. The inverter 510 is operative to perform a one's complement operation on the integer operand and the multiplexer 520, under the control of an input "sign" is operative to select the intermediate significand or the one's complement thereof.

A part of the step 1.5 of the above-described method, i.e., counting the number of leading zeros in the intermediate significand, is performed using a conventional leading zero counter ("LZC") circuit 530. Those skilled in the art are familiar with the design and operation of various conventional circuits for counting the leading zero's in a multi-bit binary number; the principles of the present invention are not limited to a particular LZC circuit, all such circuits being within the scope of the claims recited hereinafter.

The intermediate exponent derived in step 1.2 can be calculated using a conventional bias converter circuit 540, which may have an a "precision" input for controlling the operation thereof as a function of the size of the integer; e.g., causing the bias converter circuit 540 to set the exponent of the floating-point number to BIAS+15 if the number is a 16-bit integer, BIAS+31 if the number is a 32-bit integer, or BIAS+63 if the number is a 64-bit integer; the selection of a suitable value for BIAS is described hereinabove. The number of leading zero's determined by the LZC circuit 530 is subtracted from the intermediate exponent using an adder 550, and the intermediate significand is logically shifted left by this number of bits, while shifting in the sign, using a barrel shifter 550, which completes the integer conversion steps performed in the load unit 410.

The result of the load conversion in load unit 410 is then chained to an addition in adder unit 440. If the sign of the integer operand is negative, the intermediate significand is incremented at the LSB position (Step 2.1); this operation can be performed by an adder 570, with the other operand set equal to "0" and the carry-in for the adder receiving the sign bit; i.e., if the sign is negative, the intermediate significand is incremented by a carry-in of "1".

To implement step 2.2, if the adder 570 produces an overflow due to the incrementing of the intermediate significand, the intermediate exponent is incremented and the intermediate significand is right shifted to correct for the "overguess" of the normalization count in step 1.4. The incrementing of the intermediate exponent can be performed using an adder 580 having inputs of the intermediate exponent and the overflow output of adder 570. The shifting of the intermediate significand can be easily performed by coupling the output of the adder 570 to both inputs of a multiplexer 590, with the bit lines of one input right-shifted by one bit, and the output of the multiplexer controlled by the overflow output of the adder 570; i.e., if the overflow of adder 570 is "1", the right-shifted input of multiplexer 590 is selected.

Figure 6:
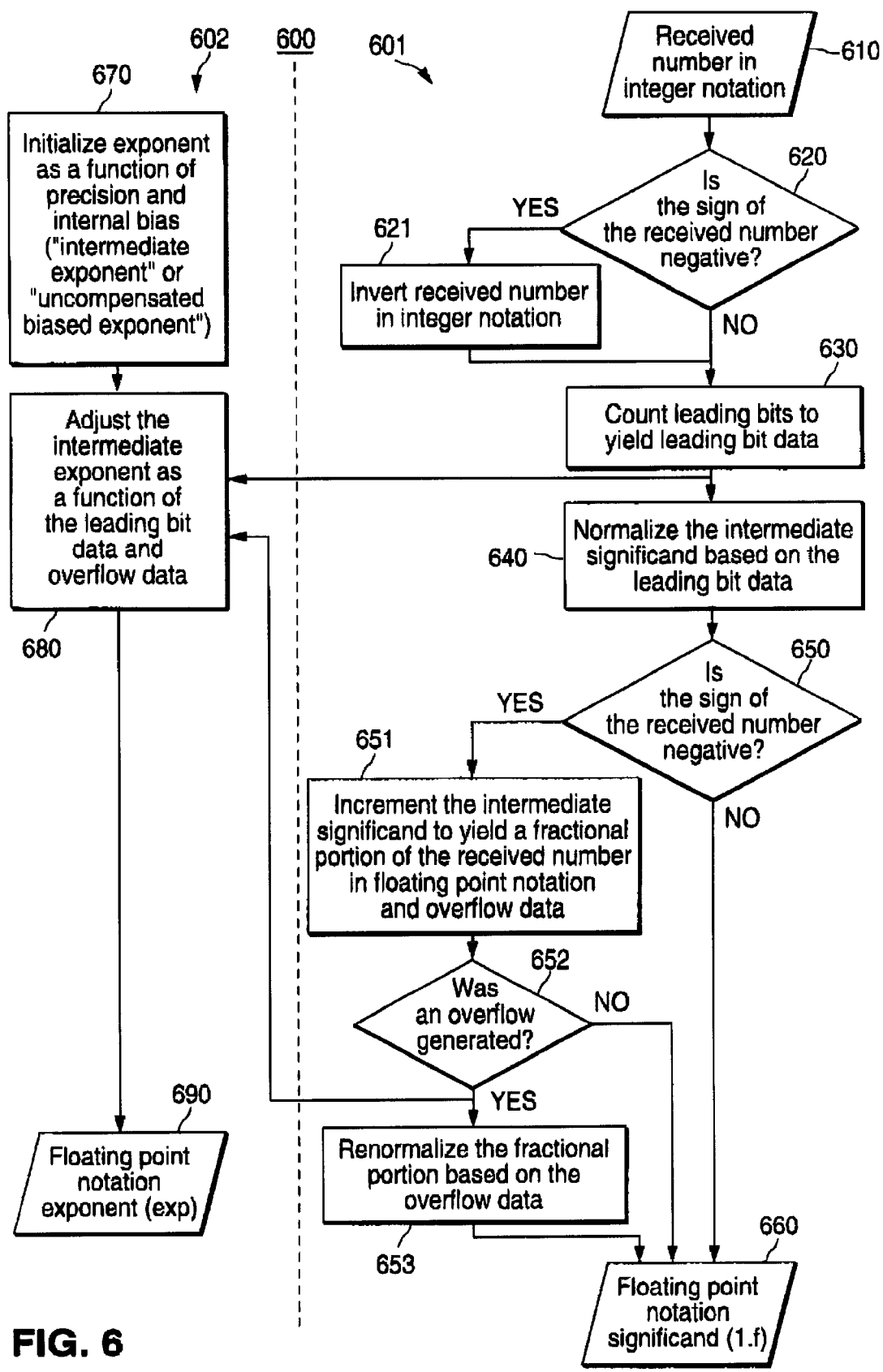
FIG. 6 illustrates a flow diagram of an exemplary embodiment of the method of the present invention.

Turning now to FIG. 6, illustrated is a flow diagram of an exemplary embodiment of the method 600 of the present invention for converting a received number in integer notation to a number in floating point notation. The exemplary method illustrated in FIG. 6 includes an independent process 601 for generating a floating point notation significand (1.f), and a dependent process 602, which is preferably run in parallel with the independent process 601, for generating a floating point notation exponent (exp); as used herein, "dependent" is used in the sense that the process depends on the availability of data generated by another process; e.g., the dependent process 602 requires knowledge of "leading bit data" and "overflow data" which are both generated within the independent process 601.

First, the independent process 601 for generating a floating point notation significand (1.f) will be described. The method illustrated in FIG. 6 assumes that the received number in integer notation, in step 610, has been normalized, as described hereinabove. In a step 620, the sign of the received number is determined. If the sign of the received number is negative, the received number is inverted in a step 621. In a step 630, leading bit data is determined; in one embodiment, the leading bit data comprises the number of leading zero's in the "intermediate significand"; as used herein, "intermediate significand" and "intermediate exponent" refer to the received number and exponent, respectively, during the conversion process. The leading bit data is used, in a step 640, to normalize the intermediate significand. If the sign of the received number is positive, step 650, then the normalized, or "shifted", intermediate significand is the resultant floating point notation significand (1.f), provided as an output of the conversion process in step 660. If the sign of the received number is negative, however, the intermediate significand must be incremented in step 651. If the incrementation performed in step 651 does not generate an overflow, determined in step 652, then the incremented intermediate significand is the resultant floating point notation significand (1.f), provided as an output of the conversion process in step 660; if the incrementation performed in step 651 does generate an overflow, however, then the incremented intermediate significand must be renormalized by at most a right shift of one bit, in a step 653, to yield the proper resultant floating point notation significand (1.f). The exponent portion of the number in floating point notation is generated by the dependent process 602.

Although illustrated in the exemplary embodiment of the method in FIG. 6 as being dependent on certain data generated by the independent process 601, those skilled in the art will recognize that the dependent process 602 can be performed substantially simultaneously with, i.e., "parallel to" independent process 601. First, in a step 670, an initial value is selected for the exponent as a function of the precision and internal bias of the FPU. Next, in a step 680, the intermediate exponent is adjusted, or "compensated" as a function of the leading bit data and overflow data, generated by the independent process 601, to yield the resultant floating point notation exponent (exp).

Although illustrated as discrete functional steps in the flow diagram of FIG. 6, those skilled in the art will recognize that certain ones of the steps may be combined, and performed simultaneously, in a physical implementation. Furthermore, those skilled in the art will recognize that the steps may be reordered in some respects without altering the desired result of the method; such modifications and alterations are within the broad scope of the claims recited hereinafter.

From the above, it is apparent that the present invention provides an efficient system and method for converting numbers from integer notation to floating point notation and a computer system employing the same. A conventional processor may be optimized employing the system or method disclosed herein without requiring any significant additional hardware and without degradation of the performance of the processor in performing tasks other than integer to floating point conversions.

Although the present invention and its advantages have been described in detail, those skilled in the art should understand that they can make various changes, substitutions and alterations herein without departing from the spirit and scope of the invention in its broadest form.

What is claimed is:

1. For use in a processor having a floating point execution core, logic circuitry for converting negative numbers from integer notation to floating point notation, comprising:

a one's complementer that receives a number in integer notation and inverts the received number to yield an inverted number;

a leading bit counter, coupled to the one's complementer, that counts leading bits in the inverted number to yield leading bit data;

a shifter, coupled to the one's complementer and the leading bit counter, that normalizes the inverted number based on the leading bit data to yield a shifted inverted number;

an adder, coupled to the shifter, that increments the shifted inverted number to yield a fractional portion of the received number in floating point notation and overflow data, the adder renormalizing the fractional portion based on the overflow data; and exponent generating circuitry, coupled to the leading bit counter and the adder, that generates an exponent portion of the received number in floating point notation as a function of the leading bit data and the overflow data.

2. The logic circuitry as recited in claim 1 further comprising a multiplexer, interposed between the one's complementer and the shifter, that selects one of the received number and the inverted number based on a sign of the received number.

3. The logic circuitry as recited in claim 1 wherein the exponent generating circuitry comprises a bias converter that generates an uncompensated biased exponent, the exponent generating circuitry adjusting the uncompensated biased exponent as a function of the leading bit data and the overflow data to yield the exponent portion.

4. The logic circuitry as recited in claim 1 wherein the leading bit counter counts a number of leading zeroes in the inverted number.

5. For use in a processor having a floating point execution core, logic circuitry for converting negative numbers from integer notation to floating point notation, comprising:

one's complementing means for inverting a received number to yield an inverted number;

leading bit counter means, coupled to the one's complementing means, for counting leading bits in the inverted number to yield leading bit data;

shifting means, coupled to the one's complementing means and the leading bit counting means, for normalizing the inverted number based on the leading bit data to yield a shifted inverted number;

adding means, coupled to the shifting means, for incrementing the shifted inverted number to yield a fractional portion of the received number in floating point notation and overflow data, the adding means renormalizing the fractional portion based on the overflow data; and exponent generating means, coupled to the leading bit counting means and the adding means, for generating an exponent portion of the received number in floating point notation as a function of the leading bit data and the overflow data.

6. The logic circuitry as recited in claim 5 further comprising multiplexing means, interposed between the one's complementing means and the shifting means, for selecting one of the received number and the inverted number based on a sign of the received number.

7. The logic circuitry as recited in claim 5 wherein the exponent generating means comprises a bias converting means for generating an uncompensated biased exponent, the exponent generating means adjusting the uncompensated biased exponent as a function of the leading bit data and the overflow data to yield the exponent portion.

8. The logic circuitry as recited in claim 5 wherein the leading bit counting means counts a number of leading zeroes in the inverted number.

9. For use in a processor having a floating point execution core, a method of for converting negative numbers from integer notation to floating point notation, comprising the steps of:

(a) inverting a received number to yield an inverted number;

(b) counting leading bits in the inverted number to yield leading bit data;

(c) normalizing the inverted number based on the leading bit data to yield a shifted inverted number;

(d) incrementing the shifted inverted number to yield a fractional portion of the received number in floating point notation and overflow data;

(e) renormalizing the fractional portion based on the overflow data; and (f) generating an exponent portion of the received number in floating point notation as a function of the leading bit data and the overflow data.

10. The method as recited in claim 9 further comprising the step of selecting one of the received number and the inverted number based on a sign of the received number after performing the step (a).

11. The method as recited in claim 9 wherein the step of generating comprises the steps of:

generating an uncompensated biased exponent; and adjusting the uncompensated biased exponent as a function of the leading bit data and the overflow data to yield the exponent portion.

12. The method as recited in claim 9 wherein the step of counting comprises the step of counting a number of leading zeroes in the inverted number.

13. A computer system, comprising:

(a) a processor having a floating point execution core containing at least one execution pipeline for executing floating point instructions, the processor capable of addressing segments of system memory coupled thereto;

(b) system memory for storing integer and floating point instructions including instructions for accessing the system memory;

(c) the processor including instruction fetch logic that fetches integer and floating point instructions from the system memory; and (d) the processor further including logic circuitry for converting negative numbers from integer notation to floating point notation, including:

(i) a one's complementer that receives a number in integer notation and inverts the received number to yield an inverted number, (ii) a leading bit counter, coupled to the one's complementer, that counts leading bits in the inverted number to yield leading bit data, (iii) a shifter, coupled to the one's complementer and the leading bit counter, that normalizes the inverted number based on the leading bit data to yield a shifted inverted number, (iv) an adder, coupled to the shifter, that increments the shifted inverted number to yield a fractional portion of the received number in floating point notation and overflow data, the adder renormalizing the fractional portion based on the overflow data, and (v) exponent generating circuitry, coupled to the leading bit counter and the adder, that generates an exponent portion of the received number in floating point notation as a function of the leading bit data and the overflow data.

14. The computer system as recited in claim 13 wherein the logic circuitry further includes a multiplexer, interposed between the one's complementer and the shifter, that selects one of the received number and the inverted number based on a sign of the received number.

15. The computer system as recited in claim 13 wherein the exponent generating circuitry comprises a bias converter that generates an uncompensated biased exponent, the exponent generating circuitry adjusting the uncompensated biased exponent as a function of the leading bit data and the overflow data to yield the exponent portion.

16. The computer system as recited in claim 13 wherein the leading bit counter counts a number of leading zeroes in the inverted number.

17. A method of operating a computer system, comprising the steps of:

(a) applying power to a processor having a floating point execution core containing at least one execution pipeline for executing floating point instructions, the processor capable of addressing segments of system memory coupled thereto;

(b) storing integer and floating point instructions in a system memory, the instructions including instructions for accessing the system memory;

(c) fetching integer and floating point instructions from the system memory; and (d) executing instructions in the processor, the processor further including logic circuitry for converting negative numbers from integer notation to floating point notation, including:

(i) a one's complementer that receives a number in integer notation and inverts the received number to yield an inverted number, (ii) a leading bit counter, coupled to the one's complementer, that counts leading bits in the inverted number to yield leading bit data, (iii) a shifter, coupled to the one's complementer and the leading bit counter, that normalizes the inverted number based on the leading bit data to yield a shifted inverted number, (iv) an adder, coupled to the shifter, that increments the shifted inverted number to yield a fractional portion of the received number in floating point notation and overflow data, the adder renormalizing the fractional portion based on the overflow data, and (v) exponent generating circuitry, coupled to the leading bit counter and the adder, that generates an exponent portion of the received number in floating point notation as a function of the leading bit data and the overflow data.

18. The method as recited in claim 17 wherein the logic circuitry further includes a multiplexer, interposed between the one's complementer and the shifter, that selects one of the received number and the inverted number based on a sign of the received number.

19. The method as recited in claim 17 wherein the exponent generating circuitry comprises a bias converter that generates an uncompensated biased exponent, the exponent generating circuitry adjusting the uncompensated biased exponent as a function of the leading bit data and the overflow data to yield the exponent portion.

20. The method as recited in claim 17 wherein the leading bit counter counts a number of leading zeroes in the inverted number.

* * * * *

UNITED STATES PATENT AND TRADEMARK OFFICE
CERTIFICATE OF CORRECTION

PATENT NO. : 6,523,050 B1
DATED : February 18, 2003
INVENTOR(S) : Atul Dhablania and Jeffrey A. Lohman It is certified that error appears in the above-identified patent and that said Letters Patent is hereby corrected as shown below:

Column 5,
Line 55, delete "30" before "which".

Signed and Sealed this

Thirty-first Day of January, 2006

JON W. DUDAS
*Director of the United States Patent and Trademark Office*